| United States Patent [19] | [11] Patent Number: 4,897,284 |
| Arai et al. | [45] Date of Patent: Jan. 30, 1990 |

[54] PROCESS FOR FORMING A DEPOSITED FILM ON EACH OF A PLURALITY OF SUBSTRATES BY WAY OF MICROWAVE PLASMA CHEMICAL VAPOR DEPOSITION METHOD

[75] Inventors: Takayoshi Arai; Shigehira Iida; Junichiro Hashizume; Tetsuya Takei, all of Ueno; Keishi Saitoh, Nabari, all of Japan

[73] Assignee: Canon Kabushiki Kaisha, Tokyo, Japan

[21] Appl. No.: 166,553

[22] Filed: Mar. 10, 1988

[30] Foreign Application Priority Data

Mar. 27, 1987 [JP] Japan ................................. 62-073561

[51] Int. Cl.$^4$ ............................................. B05D 3/06
[52] U.S. Cl. ..................................... 427/39; 427/45.1; 118/723
[58] Field of Search ................. 427/39, 45.1; 118/723

[56] References Cited

U.S. PATENT DOCUMENTS

| 4,582,720 | 4/1986 | Yamazaki | 118/723 |
| 4,678,644 | 7/1987 | Fukuta et al. | 118/723 |
| 4,729,341 | 3/1988 | Fournier et al. | 427/39 |
| 4,760,008 | 7/1988 | Yamazaki et al. | 427/39 |

FOREIGN PATENT DOCUMENTS 61-136221  6/1986  Japan ................................. 118/723

*Primary Examiner*—Stanley Silverman
*Attorney, Agent, or Firm*—Fitzpatrick, Cella, Harper & Scinto

[57] ABSTRACT

An improvement in the known MW-PCVD process for forming a deposited film on each of a plurality of cylindrical substrates being so arranged as to surround the discharging space in a substantially enclosed reaction space of a deposition chamber by the glow discharge of raw material gas to generate plasmas containing reactive gaseous materials causing the formation of said deposited film in the discharging space while rotating said plurality of substrates, which comprises providing a gas feed pipe provided with a plurality of gas liberation holes opening into the discharging space in every space between every two of the substrates so as to form an encircled discharging space and an open non-discharging space by said plurality of cylindrical substrates and a plurality of gas feed pipes and regulating the deposit thickness to be deposited per a rotation cycle of the substrate passing through the discharging space and the non-discharging space to a 1000 Å or less.

4 Claims, No Drawings

4,897,284

PROCESS FOR FORMING A DEPOSITED FILM ON EACH OF A PLURALITY OF SUBSTRATES BY WAY OF MICROWAVE PLASMA CHEMICAL VAPOR DEPOSITION METHOD

FIELD OF THE INVENTION

This invention relates to a microwave plasma chemical vapor deposition process (hereinafter referred to as "MW-PCVD process") which enables one to mass-produce a deposited film of uniform thickness and uniform homogeneity and which is excellent in optical and electric characteristics.

More particularly, it relates to a MW-PCVD process which enables one to mass-produce a functional deposited film such as amorphous silicon film, amorphous germanium film, amorphous silicon-germanium film, amorphous silicon carbide film, amorphous silicon nitride film, or amorphous silicon oxide film which may be immobilized as an amorphous semiconductor material and which is usable as a semiconductor element in electrophotographic photosensitive member, thin-film transistor, photosensor, solar cell and the like.

BACKGROUND OF THE INVENTION

Hitherto, as the element member of semiconductor device, photosensitive device for use in electrophotography, image input line sensor, image pickup device, or other optical devices, there have been proposed a number of amorphous semiconductor films, for instance, an amorphous deposited film composed of an amorphous silicon material compensated with hydrogen atom or/and halogen atom such as fluorine atom or chlorine atom [hereinafter referred to as "A-Si(H,X)"]. Some of such films have been put to practical use.

Along with those amorphous semiconductor films, there have been proposed various method for their preparation using plasma chemical vapor deposition technique wherein a raw material is decomposed by subjecting it to the action of an energy of direct current, high frequency or microwave to thereby form a deposited film on a substrate of glass, quartz, heat-resistant resin, stainless steel or aluminum. And there have been also proposed various apparatuses for practicing such methods.

Now, in recent years, the public attention has been focused on plasma chemical vapor deposition by way of MW-PCVD process.

One representative apparatus for practicing such plasma chemical vapor deposition, for example, for preparing a photoelectrographic photosensitive member, is such as disclosed in European Patent Publication No. 154,160 A1 that has a structure as shown by a schematic explanatory view of FIG. 3(A) and its X—X line cross-sectioned explanatory view of FIG. 3(B).

In FIGS. 3(A) and 3(B), there are shown a substantially enclosed reaction chamber 101, a microwave transmissive window 102 which is made of dielectric material such as alumina ceramics or quartz, a waveguide 103 which transmits a microwave from a microwave power source (not shown), an exhaust pipe 104 being connected through an exhaust valve (not shown) to an exhaust apparatus (not shown), and a plurality of cylindrical substrates 105 onto which a deposited film is to be formed and each of which being supported on a rotatable substrate holder having an electric heater 107 therein and being mechanically connected to a motor (not shown).

Numeral 106 stands for discharge space into which raw material gases are supplied from gas feed means (not shown) being mounted in the position behind the substrates 105 and which are connected to gas reservoirs (not shown).

In this apparatus, the reaction chamber has a structure of cavity resonator to resonate a frequency oscillated from the microwave power source (not shown) since the discharge is conducted upon self-induced discharge without using a trigger.

The film forming process using the apparatus shown in FIGS. 3(A) and 3(B) is carried out, for instance, in the following way.

That is, the air in the reaction chamber 101 is evacuated by opening the exhaust valve of the exhaust pipe 104 to bring about the inside to a desired vacuum. Then, the heater 107 is actuated to uniformly heat the substrate 105 to a desired temperature and it is kept at this temperature. Concurrently, the motor (not shown) is started to rotate the substrates 105 and they are kept rotating at a desired constant rotation speed.

Successively, in the case of forming an amorphous silicon film for example, silane gas ($SiH_4$) and $H_2$ gas are supplied through the gas feed means into the reaction chamber 101 at respective desired flow rates. After the flow rates of the raw material gases will have become stable, a microwave of more than 500 MHz or preferably of 2.45 GHz from the microwave power source is supplied through the waveguide 103 and the microwave transmissive window 102 in the reaction chamber 101, wherein the raw material gases are excited with a microwave energy as supplied to generate plasmas containing neutral radical particles, ion particles, electrons, etc. The thus resulted plasmas become mutually reacted to thereby form a deposited film on the surface of each of the rotating substrates 105.

Explaining the film forming process in this case by reference to FIG. 3(B), part of the surface of the substrate 105 to become situated in the front region (a) of the discharging space 106 will be exposed to an atmosphere containing uniformly distributed plasmas and because of this, a film will be uniformly deposited thereon (this film will be hereinafter called "front film"). On the other hand, other parts of the surface of the substrate 105 to become situated in the side regions (b) of the discharging space 106 will be exposed to an atmospheres containing unevenly distributed plasmas, so that films to be deposited on such other parts of the surface of the substrate will become uneven accordingly (these films will be hereinafter called "side part films"). The remaining part of the surface of the substrate 105 to become situated in the non-discharging back region (c) will not be exposed to plasma, so that said part will be maintained without being deposited with any film in said region.

In this respect, the resulting films will often become such that have defects in uniformity and also in homogeneity and that are not satisfactory in characteristics required for the light receiving layer of a photosensitive device, for example.

Therefore, there still remains an unsolved problem for the above-mentioned known film forming process that it is difficult to stably obtain a desired film suited for use as a constituent layer in semiconductor devices, photosensitive devices for use in electrophotography, image input line sensors, image pickup devices, photoelectromotive force devices or the like.

In particular, there is a problem for the above-mentioned known process in the case of mass-producing a large size electrophotographic photosensitive member having a light receiving layer of large area that it is extremely difficult to stably obtain a desired large size electrophotographic photosensitive member of uniform quality with a high yield.

SUMMARY OF THE INVENTION

The present inventors have conducted extensive studies in order to solve the problems in the aforementioned known MW-PCVD method and in order to make appropriate improvements therefor so as to make it possible to effectively form a widely usable functional deposited film having a wealth of many practically applicable characteristics without such problems as found on the known MW-PCVD method.

As a result, the present inventors have found the facts which will be later mentioned and based on such findings, developed an improved MW-PCVD method that enables efficient and stable formation of a desired functional deposited film which is widely usable as a semiconductor element in electrophotographic photosensitive member, thin-film transistor, photosensor, solar cell and the like.

It is therefore an object of this invention to provide an improved MW-PCVD method which enables to effectively and stably mass-produce a functional deposited film such as a semiconductor material film which excels in optical and electric characteristics and which is widely usable as a semiconductor element in the foregoing various devices.

Another object of this invention is to provide an improved MW-PCVD method which enables to effectively and stably mass-produce a functional deposited amorphous film such as an amorphous semiconductor material film which excels in optical and electric characteristics and which is widely usable as a semiconductor element in the foregoing various devices at high deposition rate without generation of polysilane powder caused by polymerization of a raw material gas.

A further object of this invention is to provide an improved MW-PCVD method which makes essentially or substantially hundred percent of the raw material gas to be utilized in the formation of the aforesaid functional deposited amorphous film at high deposition rate and which makes it possible to mass-produce said film on an industrial scale thereby enabling low cost production.

This invention of attaining these and other objects lies in the improvement in the process for forming a deposited film on each of a plurality of cylindrical substrates being so arranged as to surround the discharging space in a substantially enclosed reaction space of a deposition chamber by the glow discharge of raw material gas to generate plasmas containing reactive gaseous materials causing the formation of said deposited film in the discharging space while rotating said plurality cylindrical substrates, which comprises providing a gas feed pipe provided with a plurality of gas liberation holes opening into the discharging space in every space between every two of the the adjacent cylindrical substrates so as to form an encircled discharging space and an open non-discharging space by said plurality of cylindrical substrates and a plurality of gas feed pipes and regulating the deposit thickness to be deposited per a rotation cycle of each of the cylindrical substrates passing through the discharging space and the non-discharging space (hereinafter referred to as "one-cycle deposit thickness") to a 1000 Å or less.

DESCRIPTION OF THE INVENTION

Detailed explanation about this invention will be hereunder made.

The facts that the present inventors have found through repeated experiments to accomplish this invention will be hereunder explained.

Figure 3A:
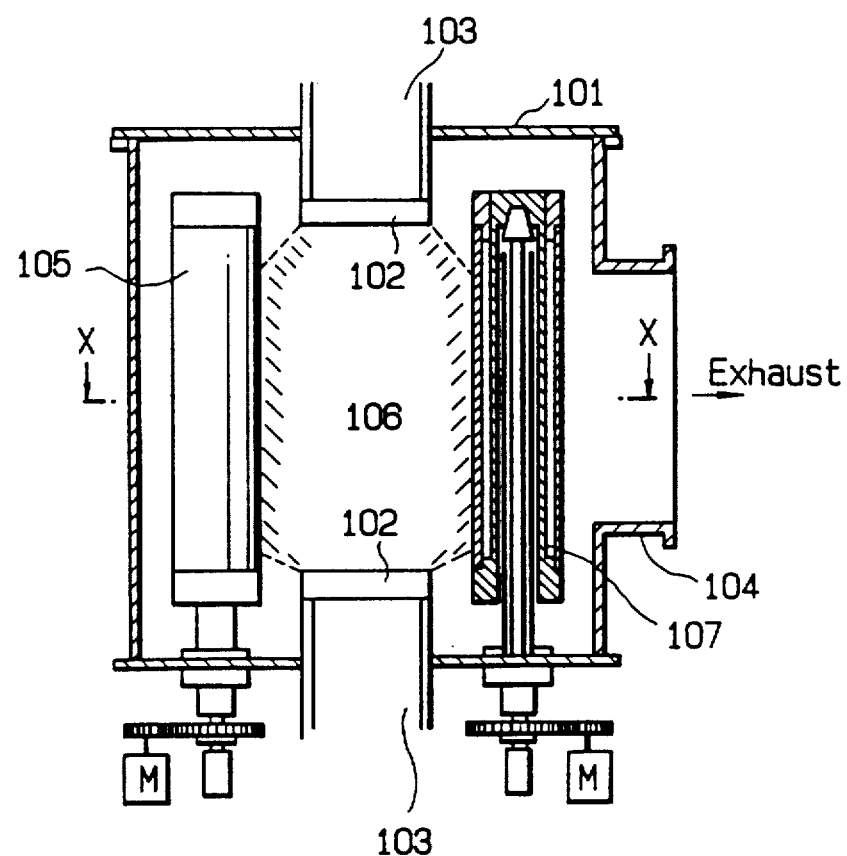
FIG. 3(A) is a schematic longitudinal sectional view, partly broken away, of the known MW-PCVD apparatus.
Figure 3B:
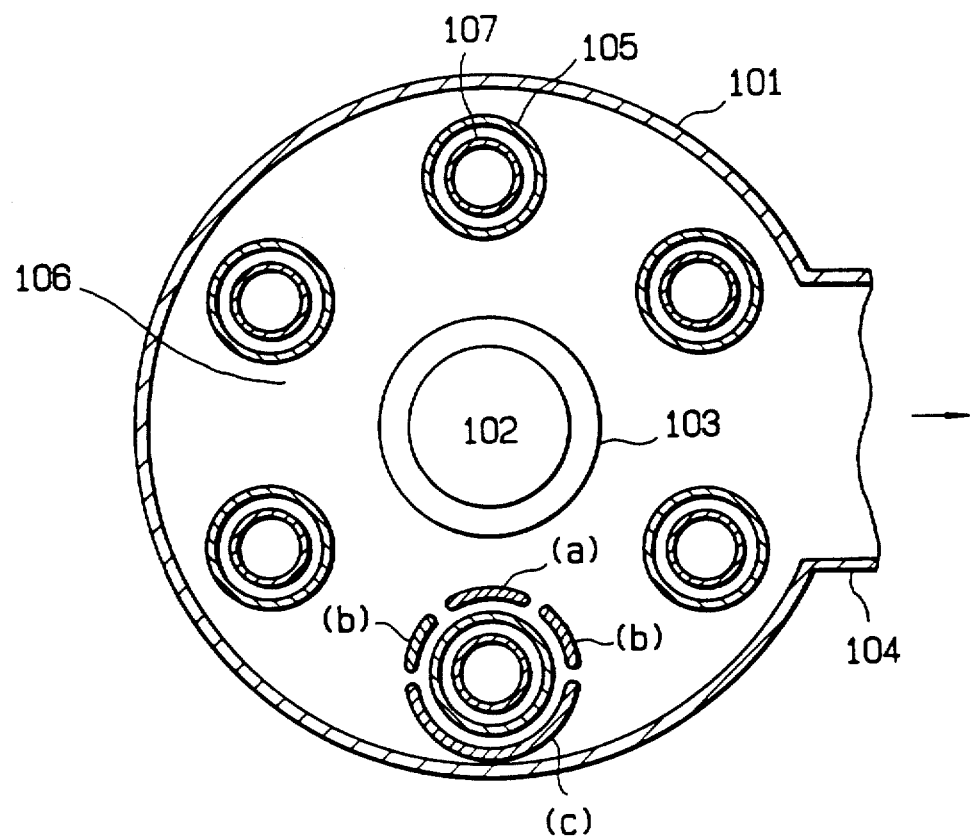
FIG. 3(B) is a schematic partial cross-sectional view for the X—X line of the MW-PCVD apparatus shown in FIG. 3(A)
Figure 8:
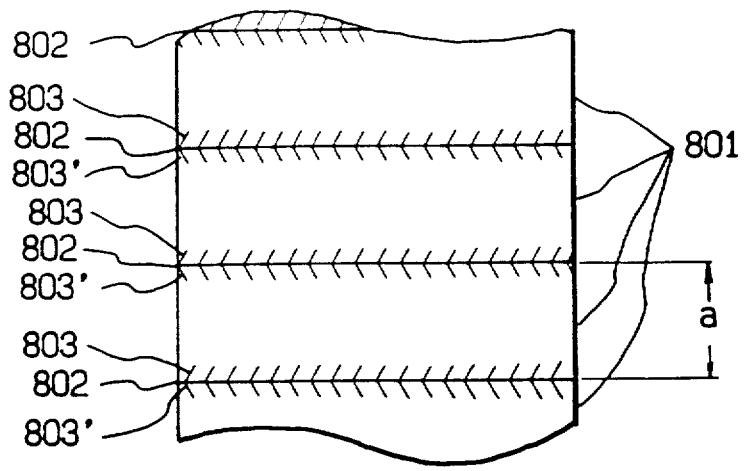
FIG. 8 is a schematic explanatory view of a photoconductive layer prepared in accordance with the known MW-PCVD process.

Firstly, as a result of preparing photoconductive layers in accordance with the foregoing known process using the MW-PCVD apparatus shown in FIGS. 3(A) and 3(B) and examining the resultant photoconductive layers, the present inventors have found a fact that every photoconductive layer has a configuration as shown in a schematic partial cross-sectional view of FIG. 8, in which are shown front films 801 formed in the front region (a) of the discharging space 106 in FIG. 3(B), interfaces 802 resulted due to the non-discharging space (c) in FIG. 3(B), and side part films 803, 803' formed in the side regions (6), (6) of the discharging space 106 in FIG. 3(B). And the mark "a" in FIG. 8 stands for the one-cycle deposit thickness. Thus, the resultant layer is comprised of a plurality of the "a" thick one-cycle deposits (films) in each of which deposit region the quality being grated in the thickness direction and it presents the so-called multilayer structured layer.

As above explained, the side part films 803, 803' eventually become inferior to the front film 801 with respect to the quality in any case. Because of this, the resulting layer containing such front films and side part films becomes such that is together accompanied with excellent characteristics because of the front film and dissatisfactory characteristics because of the side part films in a mixed state.

Figure 9:
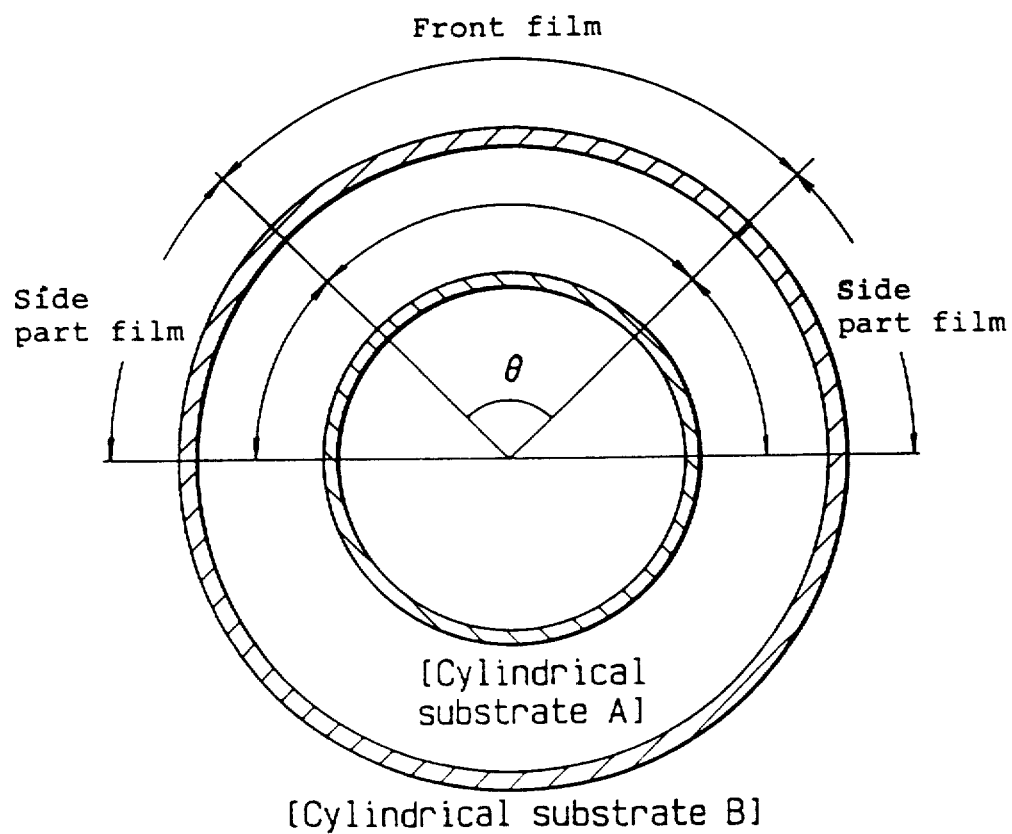
FIG. 9 is a schematic explanatory view of the relative positions for a front deposit and a back ground part deposit in the unit one-cycle deposit.

The present inventors have obtained thoughts as a result of repeated experiments that as shown in FIG. 9, the ratio of the sum of the front films to that of the side part films in the resulting layer will not depend upon the diameter of a cylindrical substrate to be used, but it will be determined by the central angle $\theta$ and remain constant without depending upon the film forming conditions such as rotation speed of the substrate, inner pressure, and the like in the film forming operation.

And, should the characteristics as a whole for the resulting layer comprised of a plurality of the foregoing one-cycle deposits (films) be determined by the foregoing ratio, it is almost impossible to obtain a desired layer by repeatedly rotating a cylindrical substrate in the discharging space and the non-discharging space using such kind MW-PCVD apparatus as shown in FIGS. 3(A) and 3(B).

The present inventors have come to a conclusion that there will be a possibility to eliminate such problems relating to the characteristics found on a layer comprised of a plurality of the foregoing one-cycle deposits which is formed in accordance with the known MW-PCVD process by relaxing the unevenness of plasmas in the side regions (b), which is found on the known MW-PCVD process as shown in FIG. 3(B), and particularly in the case where said layer is for use in an electrophotographic photosensitive member, by also making an improvement in the arrangement of the repeated one-cycle deposits in a viewpoint that the image-making process is conducted by mobilizing an electric carrier in the thickness direction of a light receiving layer of the electrophotographic photosensitive member in electrophotography.

Figure 1:
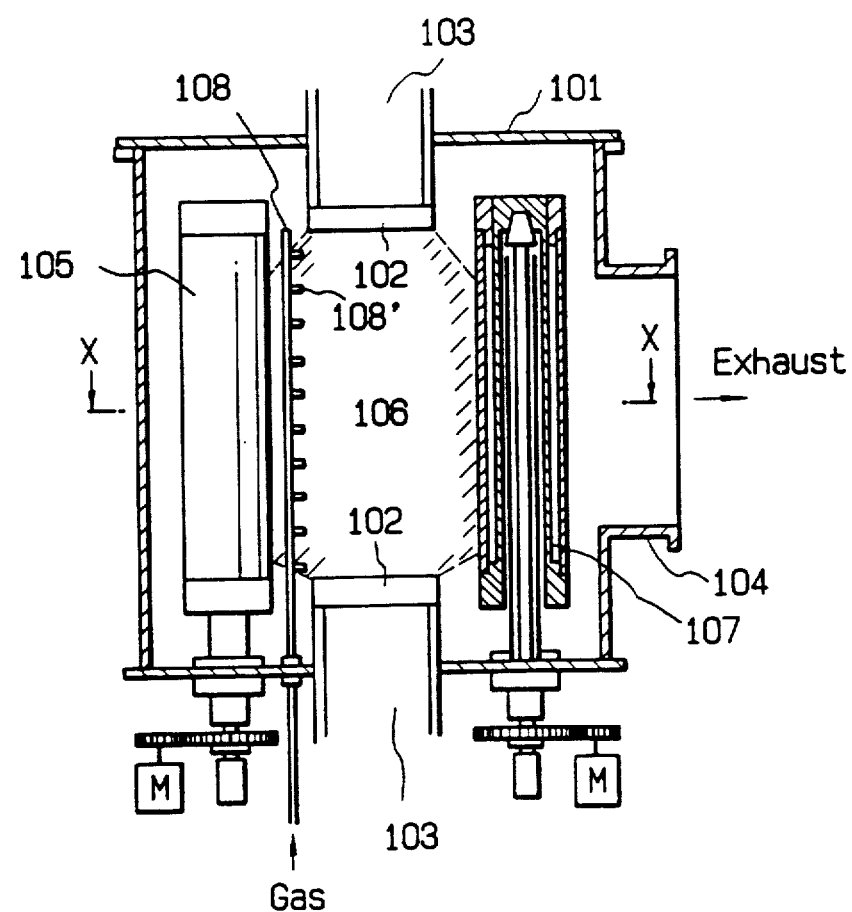
FIG. 1 is a schematic longitudinal sectional view, partly broken away, of a MW-PCVD apparatus suited for practicing the MW-PCVD process of this invention.
Figure 2:
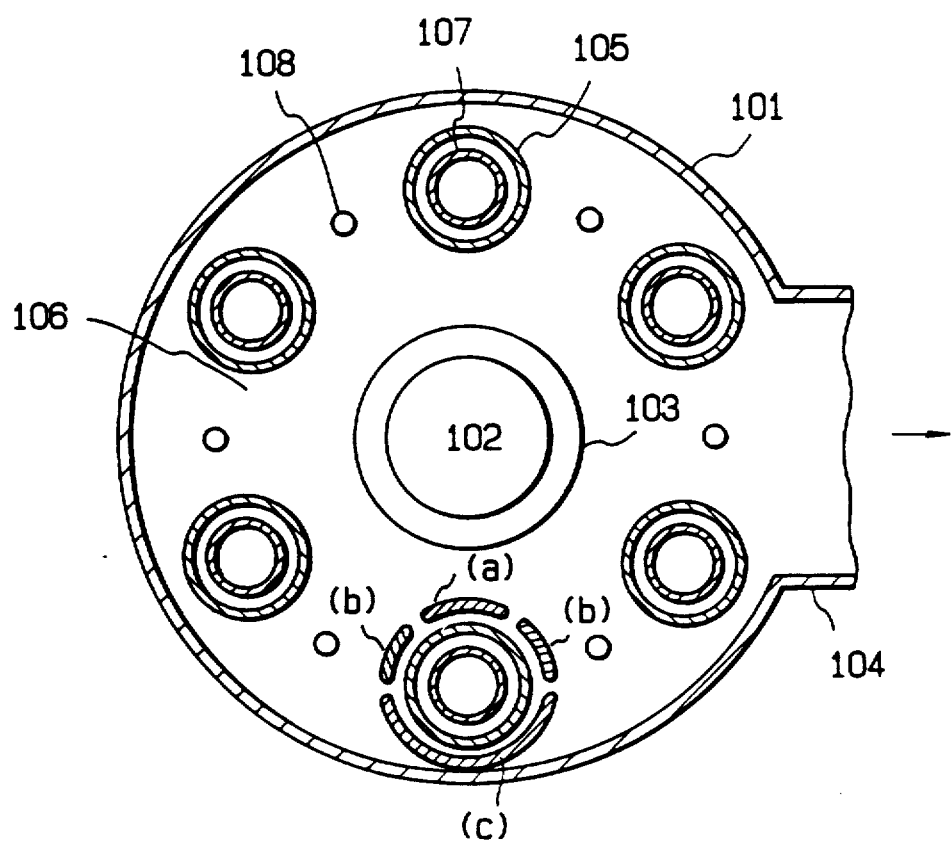
FIG. 2 is a schematic partial cross-sectional view for the X—X line of the MW-PCVD apparatus shown in FIG. 1.

Standing on the above thoughts and conclusion, the present inventors have made trials. That is, the present inventors firstly have made a modification for the known MW-PCVD apparatus shown in FIGS. 3(A) and 3(B) in a way as shown in FIGS. 1 and 2, wherein a gas feed pipe 108 provided with a plurality of gas liberation holes 108' opening into the discharging space 106 is mounted in every space between every two of the cylindrical substrates 105 so as to form an encircled discharging space by a plurality of the cylindrical substrates 105 and a plurality of the gas feed pipes 108. And there has been formed an amorphous silicon layer comprised of the foregoing one-cycle deposits being repeatedly laminated on each of the substrates with a high rotation speed. As a result, it has been found that the utilization efficiency of a raw material gas is remarkably improved, and the thickness "a" of the one-cycle deposit in FIG. 8 is reduced so that remarkable improvements bring about for the characteristics of the resulting layer.

Explanation will be made on this situation by reference to experimentally obtained graphs shown in FIGS. 4 through 12.

In the following explanation, the term "layer" means a group consisting of six layers, each of which is to be formed or has been formed on each of the six cylindrical substrates 105. And the "value" is an average of those values obtained for the six samples.

Figure 4:
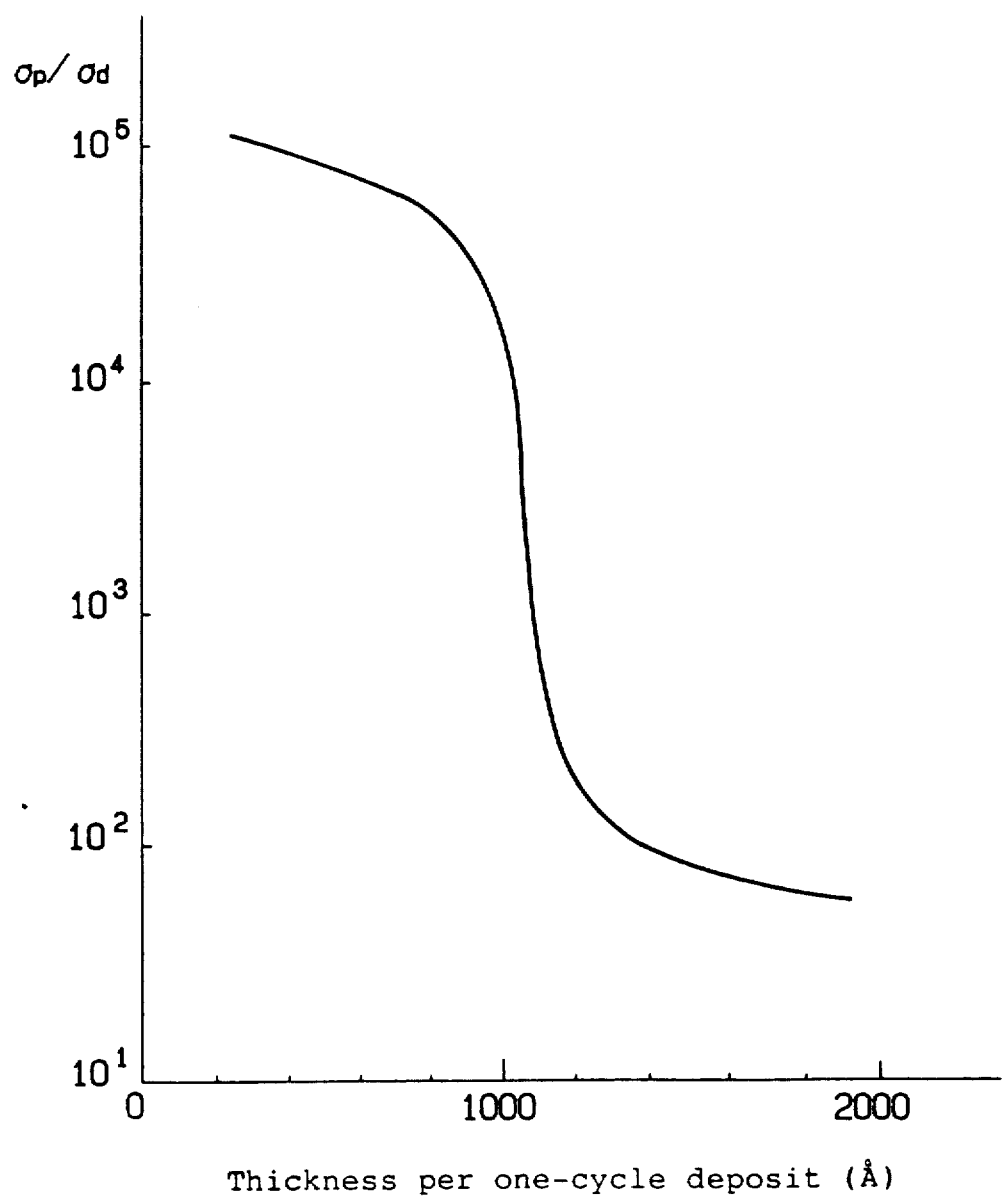
FIG. 4 is an experimentally obtained graph relating to the interrelation between the thickness of an unit one-cycle deposit to constitute a layer and the S/N ratio of said layer.

FIG. 4 is a graph about the results obtained as a result of examining the interrelation between the thickness (Å) of an one-cycle A-Si:H deposit (A-Si:H film) and the S/N ratio ($p/d$) of a layer comprised of said one-cycle deposits being repeatedly laminated which was prepared by introducing SiH$_4$ at a flow rate of 250 SCCM through the gas feed pipes 108 having a plurality of gas liberation holes 108' into the discharging space of the apparatus shown in FIGS. 1 and 2.

From the results shown in FIG. 4, it has been found that when the above thickness is 1000 Å or less, the resulting layer becomes such that has a good S/N ratio of $10^4$ to $10^5$, but when the above thickness exceeds 1000 Å, the S/N ratio of the resulting layer is suddenly decreased by about three digits.

Figure 10:
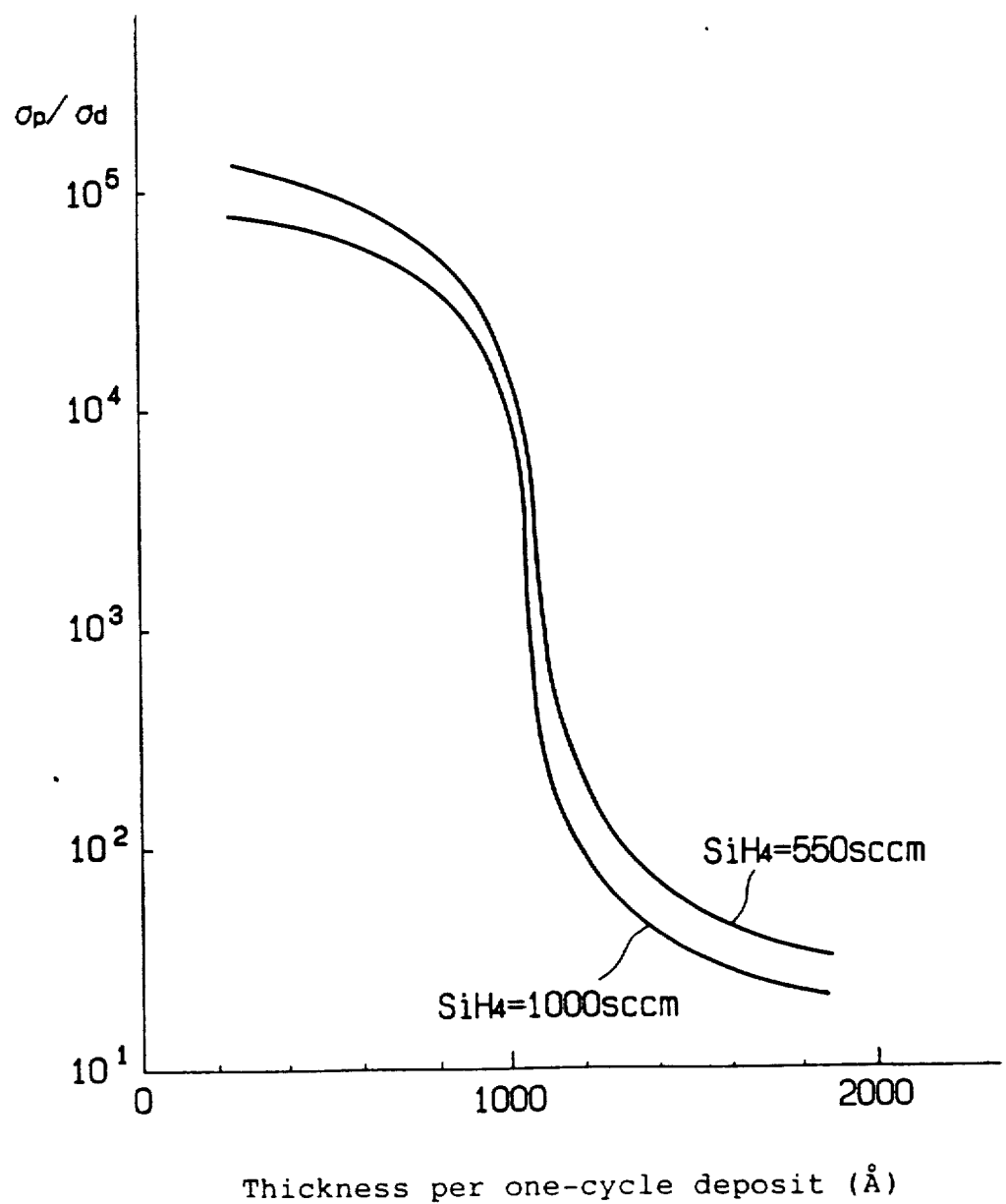
FIG. 10 contains two experimentally obtained graphs respectively relating to the interrelations between the thickness of an unit one-cycle deposit to constitute a layer in the case where $SiH_4$ was used as a raw material gas at respective flow rates of 500 SCCM and 1000 SCCM and the S/N ratios of said layer.

Then, as a result of examining the interrelation between the thickness (Å) of an one-cycle A-Si:H deposit and the S/N ratio of a layer comprised of said one-cycle deposits being repeatedly laminated which was prepared by repeating the above procedures except that the flow rate of SiH$_4$ was changed to 500 SCCM and 1000 SCCM, there were obtained the results as summerized in FIG. 10. From the results shown in FIG. 10, it has been found that there are quite similar trends to the case of FIG. 4 in each of the two cases.

In any of the above three experiments, it is a matter of course that the discharging state and the deposition rate resulted therefrom differ in respective cases due to the difference in the flow rate of a raw material gas (SiH$_4$) to be introduced. In this respect, when the thickness of an one-cycle deposit is intended to make common among the three cases, the rotation speed of the cylindrical substrate 105 is adjusted to an appropriate value accordingly in each case.

Figure 5:
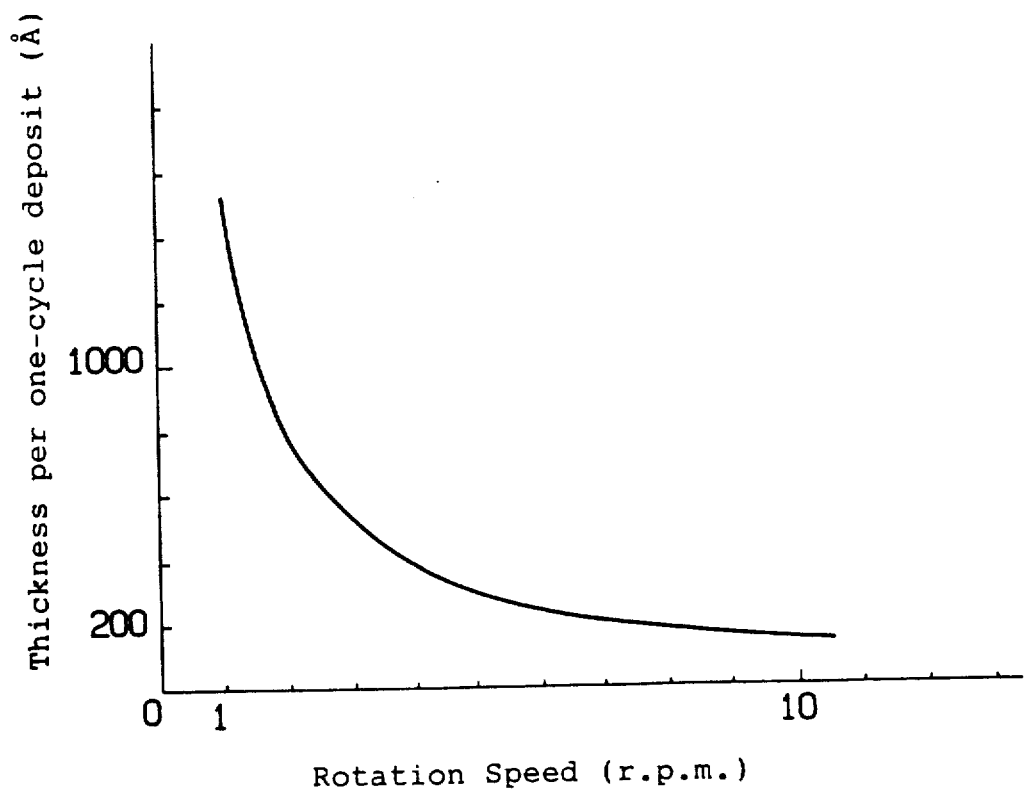
FIG. 5 is an experimentally obtained graph relating to the interrelation between the rotation speed of a cylindrical substrate and the thickness of an unit one-cycle deposit to constitute a layer in the case where $SiH_4$ was used as a raw material gas at a flow rate of 250 SCCM.
Figure 6:
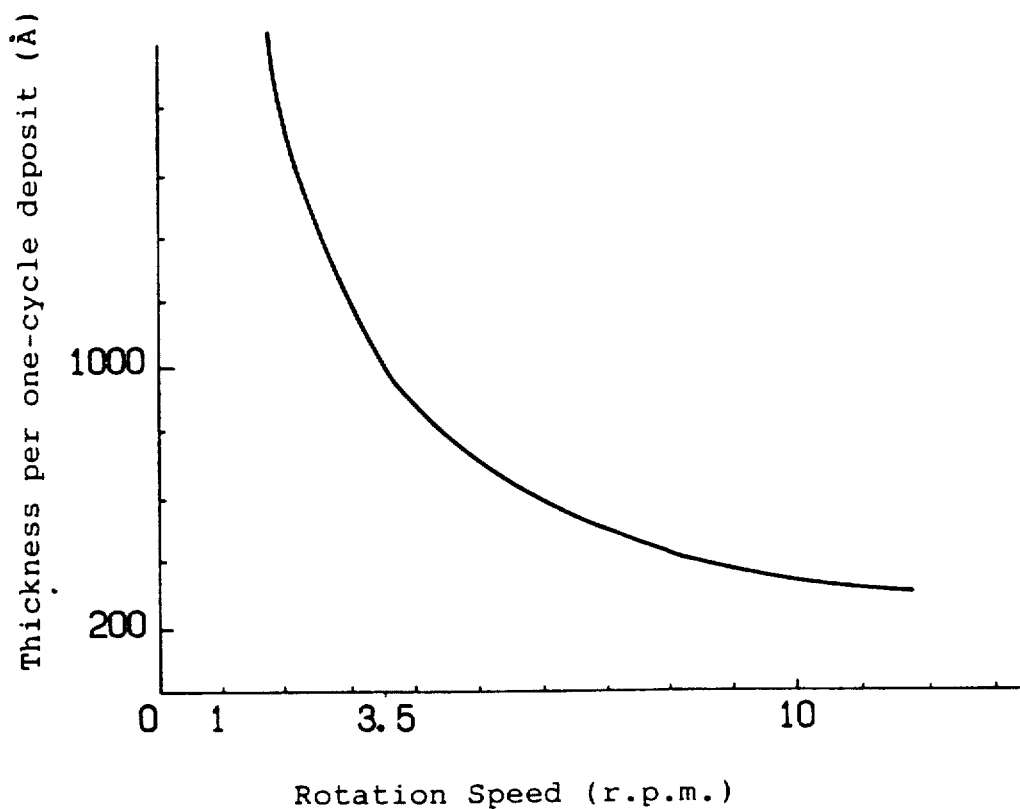
FIG. 6 is another experimentally obtained graph relating to the interrelation between the rotation speed of a cylindrical substrate and the thickness of an unit one-cycle deposit to constitute a layer in the case where $SiH_4$ was used as a raw material gas at a flow rate of 550 SCCM.
Figure 7:
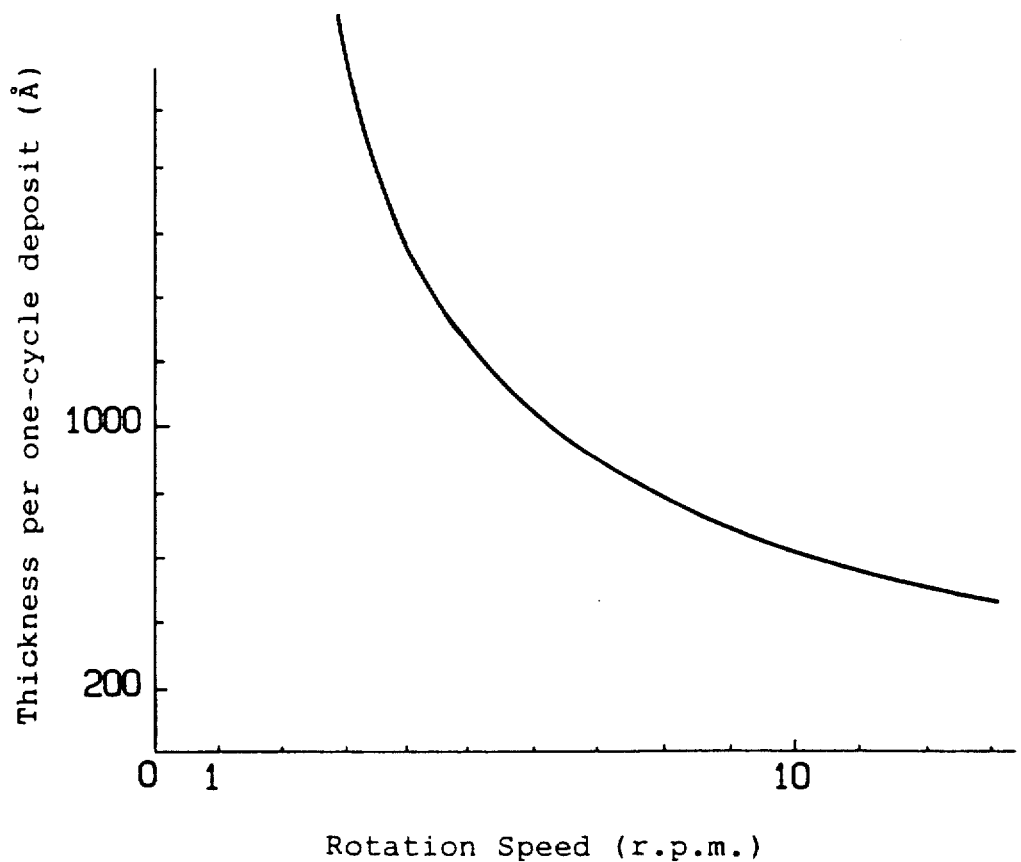
FIG. 7 is still another experimentally obtained graph relating to the interrelation between the rotation speed of a cylindrical substrate and the thickness of an unit one-cycle deposit to constitute a layer in the case where $SiH_4$ was used as a raw material gas at a flow rate of 1000 SCCM.

In FIGS. 5 to 7, there are shown experimental results obtained as a result of examining the interrelation between the rotation speed of the cylindrical substrate 105 and the thickness of the foregoing one-cycle A-Si:H deposit constituting the resulting A-Si:H layer for respective cases where the flow rate of SiH$_4$ was adjusted to 250 SCCM, 550 SCCM and 1000 SCCM respectively. From the results shown in FIGS. 5 to 7, it was found that in order to make the resulting one-cycle A-Si:H deposit to a thickness of 1000 Å, the rotation speed of the cylindrical substrate 105 is necessary to adjust to about 1.5 r.p.m. in the case of SiH$_4$=250 SCCM, about 3.5 r.p.m. in the case of SiH$_4$=550 SCCM and about 6.2 r.p.m. in the case of SiH$_4$=1000 SCCM respectively.

Figure 12:
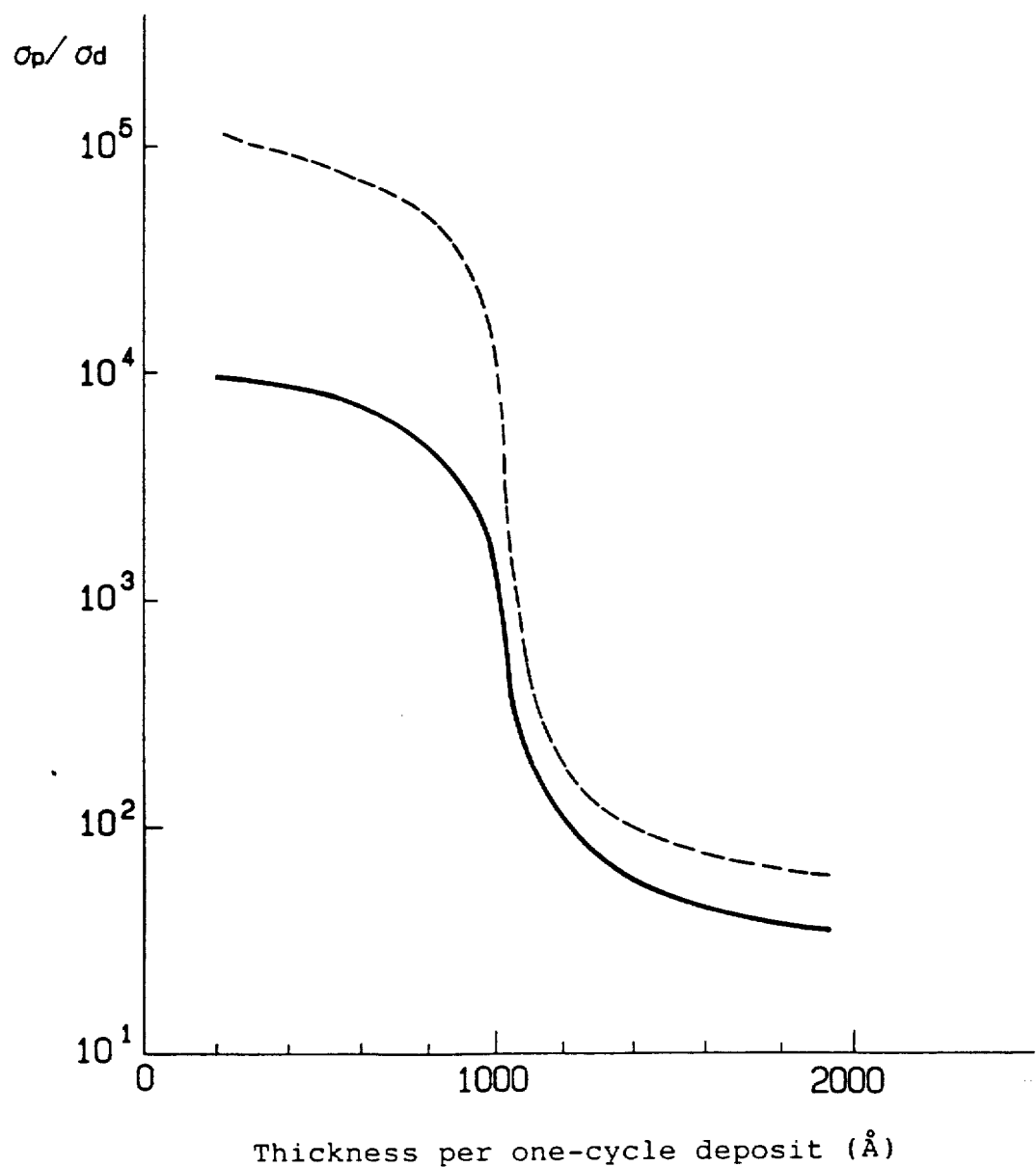
FIG. 12 contains an experimentally obtained full line graph relating to the interrelation between the thickness of an unit one-cycle deposit to constitute a layer prepared in accordance with the known MW-PCVD process and the S/N ratio of said layer and the graph of FIG. 4 (shown by a broken line) as a comparative reference.

In FIG. 12, there is shown a full line graph about the results obtained as a result of examining the interrelation between the thickness (Å) of an one-cycle A-Si:H deposit (A-Si:H film) and the S/N ratio ($\sigma p/\sigma d$) of a layer comprised of a plurality of said one-cycle deposits being repeatedly laminated which was prepared in accordance with the known MW-PCVD process using the MW-PCVD apparatus shown in FIGS. 3(A) and 3(B), by introducing SiH$_4$ into the discharging space 106 at a flow rate of 250 SCCM.

In FIG. 12, there is also shown a broken line graph of the results as shown in FIG. 4 about the samples prepared using the MW-PCVD apparatus shown in FIGS. 1 and 2 as a comparative purpose.

As the two curves in FIG. 12 illustrate, it is understood that the S/N ratios of the two samples are similar in the region exceeding 1000 Å thickness for the one-cycle deposit but they are significantly different in the region of 1000 Å or less.

From the above findings, the present inventors have found that the foregoing problems relating to the characteristics of a layer comprised of a plurality of one-cycle deposits (films) respectively containing the front deposit (film) and the side part deposits (films) being repeatedly laminated which is prepared in accordance with the known MW-PCVD process using the known MW-PCVD apparatus shown in FIGS. 3(A) and 3(B) can be eliminated in the case of purposely decreasing the thickness of an unit one-cycle deposit (film) to constitute the layer to thereby decrease the thickness of the side part deposit (film) in said unit one-cycle deposit (film) and disperse it in the entire region of the resulting layer, by carring out the film forming MW-PCVD process using the apparatus shown in FIGS. 1 and 2. In addition to this, the present inventor have found that the substantial condition in order to stably obtain expected effects in the above case does not depend upon the film forming conditions such as rotation speed of the cylindrical substrate 105, but it is related to the thickness of the unit one-cycle deposit (film), the detailed value of which is 1000 Å or less.

In order to confirm this situation, the present inventors have tried to prepare plural kinds of electrophotographic photosensitive members by varying the parameters relating to the film forming conditions.

As a result, the present inventors have confirmed that a desired electrophotographic photosensitive member having an improved light receiving layer excellent in optical and electric characteristics can be obtained as long as the thickness of an unit one-cycle deposit (film) of the light receiving layer is adjusted to a value of 1000 Å or less. This invention has been accomplished based on what above mentioned.

This invention is to make an improvement in the known MW-PCVD process for forming a deposited film on each of a plurality of cylindrical substrates being so arranged as to surround the discharging space in a substantially enclosed reaction space of a deposition chamber by the glow discharge of raw material gas to generate plasmas containing reactive gaseous materials causing the formation of said deposited film in the discharging space while rotating said plurality of substrates, which comprises providing a gas feed pipe provided with a plurality of gas liberation holes opening into the discharging space in every space between every two of the substrates so as to form an encircled discharging space and open non-discharging space by said plurality of cylindrical substrates and a plurality of gas feed pipes and regulating the deposit thickness to be deposited per a rotation cycle of the substrate passing through the discharging space and the non-discharging space to a 1000 Å or less.

As the gas feed pipe to be used in this invention, representatively, it is such as shown in FIG. 1 that is of cylindrical bar shape with which side wall in the side of the discharging space a plurality of thin bar-like shaped nozzles to allow a raw material gas to be fed into said discharging space are provided.

Other than this, the gas feed pipe may be a cylindrical bar-like shaped pipe having a plurality of gas liberation holes capable of allowing a raw material gas to be fed into the discharging space with its side wall in the side of said discharging space.

It is desired for such gas feed pipe to be vertically arranged in the middle position of every space between every two cylindrical substrates which is situated on or near the circle line drawn by linking respective centers of the cylindrical substrates so that an encircled discharging space may be desirably established in the reaction chamber.

And the gas feed pipe to be used in this invention may be such that is made of a metal such as stainless steel, aluminum, etc., alumina ceramics or quartz.

In a preferred embodiment in order to desirably practice the process of this invention, at least the deposition rate and the rotation speed (r.p.m.) of the cylindrical substrate among other film forming conditions should be properly adjusted.

For instance, a relatively high deposition rate is employed and, the rotation speed of the cylindrical substrate is made high to shorten the rotation cycle of the cylindrical substrate to thereby shorten the period of the surface of the cylindrical substrate to be exposed to discharged plasmas.

In order to practice the MW-PCVD process of this invention in a way as above mentioned, a due regard should be made to the following point that the deposition rate at a given point of the substrate's curved surface will be gradually changed within one rotation cycle of the substrate as the angle of the given point toward the discharging center of the discharging space momentarily changes following the rotation of the substrate.

It is difficult to set up a commonly employable interrelation between the deposition rate and the rotation speed of the substrate other than the foregoing thickness of an unit one-cycle deposit (film) for the MW-PCVD process of this invention.

However, as for the rotation speed (r.p.m.) of the substrate to make the thickness of an unit one-cycle deposit (film) to be of 1000 Å or less in order to form an objective layer according to the MW-PCVD process of this invention, it is possible to be set up, for example, by the following way. That is, firstly, there is formed a layer on a cylindrical substrate with a chosen rotation speed for certain period of time using the MW-PCVD apparatus shown in FIGS. 1 and 2. Then, the thickness of the resultant layer is measured and the deposition rate per minute (Å/min) is calculated from the measured result. And the value of the deposition rate thus obtained is divided by 1000 (Å) to thereby obtain a value corresponding to the rotation speed (r.p.m.) necessary to form a 1000 Å thick unit one-cycle deposit (film). And in the case of making the thickness of said one-cycle deposit (film) to be less than 1000 Å, the rotation speed of the substrate is adjusted to the above obtained value or more.

In this invention, it is sufficient for the thickness of the foregoing unit one-cycle deposit (film) to be regulated to 1000 Å or less. However, in a most preferred embodiment, said thickness is regulated to 500 Å or less. In this case, there can be formed a further desirable layer.

As for the inner pressure in the discharging space, when it is made relatively high, the ratio of the back ground part deposit to the front deposit in the foregoing unit one-cycle deposit is likely to increase.

Figure 11:
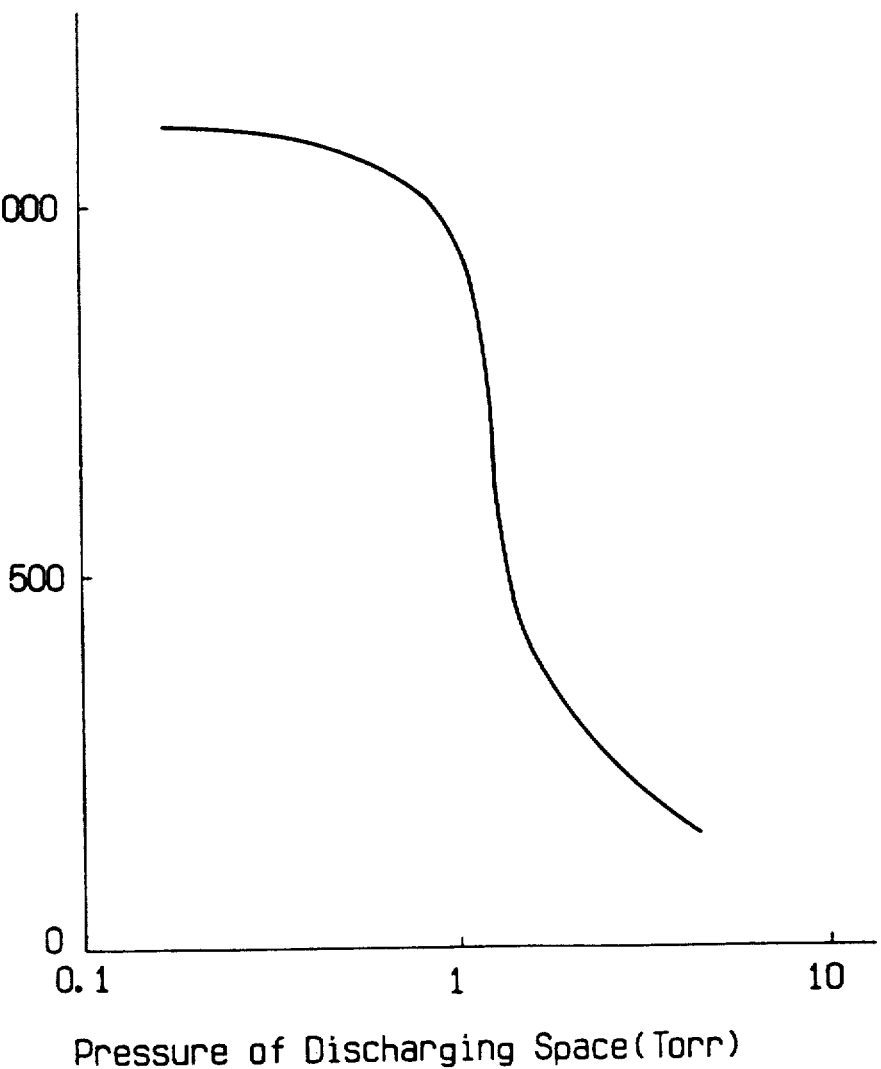
FIG. 11 is a graph relating to the interrelation between an inner pressure in the discharging space and the thickness of the unit one-cycle deposit necessary to obtain a layer having a S/N ratio of $10^4$.

FIG. 11 is a graph about the results obtained as a result of examining the interrelation between the inner pressure in the discharging space and the thickness of an unit one-cycle deposit (film) required for obtaining a layer having a value of $10^4$ for the S/N ratio by repeating the procedures of the experiment in the case of FIG. 4 in which the flow rate of $SiH_4$ being controlled to 250 SCCM.

From the results of FIG. 11, it was found that when the inner pressure in the discharging space exceeds a value of more than 1 Torr, an employable range of the thickness of the unit one-cycle deposit is suddenly narrowed. And it was also found that in the case where said inner pressure is intended to adjust to a value of 1 Torr or less, an employable range for said thickness is widened. As a result of further studies based on these findings, the present inventors have found a desired range of the foregoing inner pressure. That is, the inner pressure in the discharging space in the MW-PCVD process of this invention is preferablyadjusted to a value of less than 1 Torr as the upper limit and to a value of more than $1 \times 10^{-5}$ Torr as the lower limit. In a most preferred embodiment in this respect, it is a value of $1 \times 10^{-2}$ Torr to $1 \times 10^{-4}$ Torr.

In this invention, it is the essential factor to regulate the thickness of an unit one-cycle deposit (film) to a value of 1000 Å or less in order to obtain an objective desired layer. As for its practically employable lower limit is about 40 Å.

A reason for this is that when it is regulated to a small value, it is necessary to regulate the rotation speed (r.p.m.) of the substrate to a high level accordingly. In this case, there will occur problems such as chatterings of the substrate, unevenness of discharged plasmas due to the chatterings, leakage of the enclosed atmosphere to the open air also due to the chattering, etc. In view of this, the upper limit for the rotation speed of the substrate is 70 r.p.m..

And in the case of forming a light receiving layer for an electrophotographic photosensitive member in accordance with the MW-PCVD process of this invention, it is desired to carry out the layer formation at a deposition rate of more than 50 Å/sec. In this case, should the rotation speed of the substrate be adjusted to 70 r.p.m., the thickness of an unit one-cycle deposit (film) to constitute said layer will become to be about 40 Å.

Another reason is that in the case where the thickness of said unit one-cycle deposit (film) is made extremely small, the number of said unit one-cycle deposits (films) to constitute said layer becomes great and because of this, there will often occur a problem that constituent one-cycle deposits (films) be peeled off.

In view of the above, it is desired for the lower limit of the thickness of the one-cycle deposit (film) to be regulated to 40 Å.

DESCRIPTION OF THE PREFERRED EMBODIMENTS

The advantages of this invention are now described in more detail by reference to the following Examples 1 through 4 which are provided here for illustrative purposes only, and are not intended to limit the scope of this invention.

In each of the examples, an electrophotographic photosensitive member was prepared by the MW-PCVD method of this invention using the MW-PCVD apparatus shown in FIGS. 1 and 2.

FIG. 1 is a schematic longitudinal section view of the MW-PCVD apparatus suited for practicing the MW-PCVD method of this invention, and FIG. 2 is a schematic X—X line cross-sectioned view of the apparatus shown in FIG. 1.

Referring FIG. 1 and FIG. 2, the MW-PCVD apparatus suited for practicing the MW-PCVD method of this invention comprises substantially enclosed reaction chamber 101 having a reaction space (discharge space) 106, microwave transmissive windows 102 made of quartz, metallic waveguides 103 being connected through impedance matching box isolator to microwave power source (not shown), exhaust pipe 104 (being connected through a main valve to a diffusion pump (not shown), cylindrical substrates 105 placed on a substrate holder in which electric heater 107 being installed and which is mechanically connected to a rolating motor (not shown), gas feed pipes 108 having a plurality of gas liberation holes 108' comprised of bar-like shaped nozzles and being connected through mass flow controllers (not shown) to gas reservoirs for raw material gases.

The gas feed pipes 108 are made of microwave transmissive dielectric material. The gas liberation holes 108' provided with each of the gas feed pipes 108 are so open that raw material gas may be uniformly fed into the reaction space (discharge space) 106.

EXAMPLE 1

There were prepared six electrophotographic photosensitive members respectively having a charge injection inhibition layer, a photoconductive layer and a surface layer using six aluminum cylinders as the cylindrical substrates 105.

As the raw material gases, there were used $SiH_4$, $H_2$, $B_2H_6$ and NO for the formation of the charge injection inhibition layer, $SiH_4$ and $H_2$ for the formation of the photoconductive layer and $SiH_4$ and $CH_4$ for the formation of the surface layer.

Firstly, respective cylindrical aluminum substrates 105 were placed on respective substrate holders in the reaction chamber 101 and all the substrates are made rotating by revolving the motor. Thereafter, the air in the reaction chamber 101 was evacuated by the action of the diffusion pump to thereby bring the space to a vacuum of about $10^{-6}$ Torr. Then, the electric heaters 107 were actuated to heat the substrates 105 to a desired temperature (about 250° C.) and they were kept at this temperature.

Successively, $SiH_4$, $H_2$ and $B_2H_6/H_2$ were fed through the gas feed pipes 108 and the gas liberation holes into the reaction space (discharge space) 106 at respective flow rates shown in Table 1. Then, the rotation speed of the substrates 105 was regulated to 10 r.p.m. and the inner pressure of the reaction chamber was adjusted to 1.5 m Torr by regulating the exhaust valve of the exhaust pipe 104.

After the flow rates of the raw material gases, the inner pressure of the reaction chamber 101 and the rotation speed of the substrates 105 became all stable, microwave of 2.45 GHz from the microwave power source was supplied through the waveguides 103 and the microwave transmissive windows 102 into the reaction space (discharge space) 106.

In this event, the raw material gases as introduced were effectively excited and an objective charge injection inhibition layer was formed on each of the six substrates 105.

The above procedures for the formation of the charge injection inhibition layer were repeated to form successive photoconductive layer and surface layer on the previously formed charge injection inhibition layer with the respective conditions shown in Table 1, whereby obtaining six electrophotographic photosensitive members.

As a result of evaluating charge retentivity, sensitivity, residual potential, smeared image, ghost and defective image on each of the resultant six electrophotographic photosensitive members using a modification of Canon's electrophotographic copying machine NP 7550 for use in experimental purposes (product of CANON KABUSHIKI KAISHA), there were obtained excellent results as shown in Table 2 for every resultant electrophotographic photosensitive member.

And, as a result of examining the thickness of the photoconductive layer for each of the resultant electrophotographic photosensitive members, it was found that it is 450 Å for every case.

COMPARATIVE EXAMPLE 1

Using the known MW-PCVD apparatus shown in FIGS. 3(A) and 3(B), wherein raw material gases being supplied through the gas feed means mounted in the back position the reaction chamber, the procedures of Example 1 were repeated to thereby prepare six electrophotographic photosensitive members respectively a charge injection inhibition layer, a photoconductive layer and a surface layer.

As a result of examining the raw material gas utilization efficiency in the preparation of said electrophotographic photosensitive members in the reaction chamber, it was found that said efficiency is about 7% smaller than that in the case of Example 1.

And, as a result of evaluating the resultant six electrophotographic photosensitive members in the same way as in Example 1, it was found that their figures with respect to charge retentivity and sensitivity are about ⅔ of those of the electrophotographic photosensitive members prepared in Example 1.

EXAMPLE 2 AND COMPARATIVE EXAMPLE 2

The procedures of Example 1 were repeated, except that the rotation speed of the substrates 105 was changed as shown in Table 3, to thereby prepare electrophotographic photosensitive member samples 2001 to 2005 and comparative electrophotographic photosensitive member samples 2006 to 2007, wherein photosensitive members were concurrently prepared for every sample.

Every sample was evaluated in the same way as in Example 1. The results obtained were as shown in Table 4.

As a result of examining the thickness of the photoconductive layer for every sample, there were obtained the results as shown in Table 4.

EXAMPLE 3 AND COMPARATIVE EXAMPLE 3

The procedures of Example 1 were repeated, except that the raw material gases and their flow rates and the rotation speed of the substrates 105 for the formation of the photoconductive layer were changed respectively as shown in Table 5, to thereby prepare electrophotographic photosensitive member samples 3001 to 3006 respectively consisting of six electrophotographic photosensitive members.

As a result of evaluating every sample in the same way as in Example 1, there were obtained the results as shown in Table 6. And as a result of examining the thickness of the photoconductive layer for every sample, there were obtained the results as shown in Table 6.

EXAMPLE 4 AND COMPARATIVE EXAMPLE 4

The procedures of Example 1 were repeated, except that the inner pressure of the reaction space (discharge space) 106 for the formation of the photoconductive layer was changed as shown in Table 7, to thereby prepare electrophotographic photosensitive member samples 4001 to 4006 respectively consisting of six electrophotographic photosensitive members.

As a result of evaluating every sample in the same way as in Example 1, there were obtained the results as shown in Table 8.

TABLE 1

| Layer forming conditions | Constituent layer | | |
| --- | --- | --- | --- |
| | Charge injection inhibition layer | Photo-conductive layer | Surface layer |
| Raw material gas & its flow rate | | | |
| SiH$_4$ | 500 sccm | 800 sccm | 200 sccm |
| H$_2$ | 500 sccm | 500 sccm | — |
| B$_2$H$_6$/H$_2$ | 2000 ppm (against SiH$_4$) | — | — |
| NO | 20 sccm | — | — |
| CH$_4$ | — | — | 1000 sccm |
| Inner pressure | 1.5 mTorr | 2 mTorr | 3 mTorr |
| Microwave power (2.45 GHz) (W/cm$^2$) | 700 W | 1500 W | 1000 W |
| Rotation speed of the substrate (r.p.m) | | 10 | |

TABLE 2

| Charge retentivity | Sensitivity | Residual potential | Smeared image | Ghost | Defective image |
| --- | --- | --- | --- | --- | --- |
| ⊚ | ⊚ | ⊚ | ○ | ○ | ○ |

⊚: Excellent
○: Good
x: Practically not usable

TABLE 3

| | Sample No. | | | | | | |
| --- | --- | --- | --- | --- | --- | --- | --- |
| | 2001 | 2002 | 2003 | 2004 | 2005 | 2006* | 2007* |
| Rotation speed of the substrate (r.p.m.) | 5 | 7 | 17 | 20 | 50 | 1 | 4 |

*Comparative Example

TABLE 4

| Sample No. | Charge retentivity | Sensitivity | Residual potential | Smeared image | Ghost | Defective image | Average thickness of the photoconductive layer (Å) |
|---|---|---|---|---|---|---|---|
| 2001 | ○ | ○ | ○ | ○ | ○ | ○ | 900 |
| 2002 | ○ | ○ | ○ | ○ | ○ | ○ | 640 |
| 2003 | ◎ | ◎ | ◎ | ○ | ○ | ○ | 300 |
| 2004 | ◎ | ◎ | ◎ | ○ | ○ | ○ | 220 |
| 2005 | ◎ | ◎ | ◎ | ○ | ○ | ○ | 90 |
| 2006* | X | X | X | X | X | ○ | 4000 |
| 2007* | ○ | X | X | ○ | X | ○ | 1100 |

*Comparative Example
◎: Excellent
○: Good
X: Practically not usable

TABLE 5

| | | Sample No. | | | | | |
|---|---|---|---|---|---|---|---|
| | | 3001 | 3002 | 3003 | 3004 | 3005 | 3006 |
| Photoconductive Layer | | | | | | | |
| SiH$_4$ | (sccm) | 700 | 600 | 800 | 600 | 500 | 1000 |
| H$_2$ | (sccm) | 300 | 400 | 600 | 200 | 0 | 300 |
| SiF$_4$ | (sccm) | 30 | 60 | 50 | 0 | 0 | 40 |
| B$_2$H$_6$/H$_2$ | (ppm) | 3 | 50 | 3 | 0 | 0 | 10 |
| Rotation speed | A | 20 | 17 | 30 | 45 | 5 | 50 |
| of the | B | 4.5 | 4 | 5 | 3.5 | 3 | 7 |
| substrate (r.p.m.) | C* | 3.5 | 3 | 4.5 | 3 | 2.5 | 5.5 |

*Comparative Example

TABLE 6

| Sample No. | | Charge retentivity | Sensitivity | Residual potential | Smeared image | Ghost | Defective image | Average thickness of the photoconductive layer (Å) |
|---|---|---|---|---|---|---|---|---|
| 3001 | A | ◎ | ◎ | ◎ | ○ | ○ | ○ | 200 |
| | B | ◎ | ○ | ○ | ○ | ○ | ○ | 900 |
| | C* | ○ | X | X | ○ | X | ○ | 1150 |
| 3002 | A | ◎ | ◎ | ◎ | ○ | ○ | ○ | 200 |
| | B | ○ | ○ | ○ | ○ | ○ | ○ | 850 |
| | C* | X | X | X | ○ | X | ○ | 1150 |
| 3003 | A | ◎ | ◎ | ◎ | ○ | ○ | ○ | 160 |
| | B | ○ | ○ | ○ | ○ | ○ | ○ | 950 |
| | C* | X | X | X | ○ | X | ○ | 1050 |
| 3004 | A | ◎ | ◎ | ◎ | ○ | ○ | ○ | 70 |
| | B | ◎ | ○ | ○ | ○ | ○ | ○ | 900 |
| | C* | ○ | X | X | ○ | X | ○ | 1050 |
| 3005 | A | ○ | ○ | ○ | ○ | ○ | ○ | 560 |
| | B | ○ | ○ | ○ | ○ | ○ | ○ | 900 |
| | C* | ○ | X | X | ○ | X | ○ | 1100 |
| 3006 | A | ◎ | ◎ | ◎ | ○ | ○ | ○ | 125 |
| | B | ○ | ○ | ○ | ○ | ○ | ○ | 900 |
| | C* | X | X | X | X | X | ○ | 1150 |

*Comparative Example
◎: Excellent
○: Good
X: Practically not usable

TABLE 7

| | 4001 | 4002 | 4003 | 4004 | 4005 | 4006* |
|---|---|---|---|---|---|---|
| Inner pressure at the time of forming photo conductive layer (mTorr) | 1 | 10 | 100 | 500 | 1000 (1 Torr) | 1200 (1.2 Torr) |

*Comparative Example

TABLE 8

| Sample No. | Charge retentivity | Sensitivity | Residual potential | Smeared image | Ghost | Defective image |
|---|---|---|---|---|---|---|
| 4001 | ◎ | ◎ | ◎ | ○ | ○ | ○ |
| 4002 | ◎ | ◎ | ◎ | ○ | ○ | ○ |
| 4003 | ◎ | ◎ | ○ | ○ | ○ | ○ |
| 4004 | ○ | ○ | ○ | ○ | ○ | ○ |
| 4005 | ○ | ○ | ○ | ○ | ○ | ○ |

TABLE 8-continued

| Sample No. | Charge retentivity | Sensitivity | Residual potential | Smeared image | Ghost | Defective image |
|---|---|---|---|---|---|---|
| 4006* | ◯ | X | X | ◯ | X | ◯ |

*Comparative Example
◯: Excellent
◯: Good
X: Practically not usable

We claim:

1. In a process for the formation of a functional deposited film on a plurality of cylindrical substrates by means of microwave plasma chemical vapor deposition using a microwave plasma chemical vapor deposition apparatus having a cylindrical deposition chamber comprising a circumferential wall having an end portion thereof provided with a microwave introducing window to which a waveguide extending from am microwave power source is connected, said cylindrical deposition chamber having a discharging space in which a plasma is formed, a non-discharging space in which a plasma is not formed and a plurality of rotatable cylindrical substrate holders disposed therein, each of said substrate holders capable of having one of said cylindrical substrates positioned thereon, said rotatable cylindrical substrate holders being concentrically arranged in said cylindrical deposition chamber so as to circumscribe said discharging space, said cylindrical deposition chamber being provided with means for supplying a film-forming raw material gas into said discharging space, said means for supplying said film-forming raw material gas including at least one gas liberation hole open to said discharging space and said cylindrical deposition chamber also provided with means for evacuating said cylindrical deposition chamber, said process including forming said deposited film on each of said cylindrical substrates by glow discharge of film-forming raw material gas in order to generate said plasma to effect the formation of said deposited film in said discharging space while rotating said cylindrical substrates, the improvement which comprises:
   (a) disposing said means for supplying a film-forming raw material gas in a space between an adjacent pair of said circumscribed by said plurality of film-forming raw material gas-supplying means; and (b) regulating the thickness of said deposited film to 1000 Å or less formed on each of said cylindrical substrates for each cycle of rotation of said substrate passing through said discharging space.

2. The process according to claim 1 wherein the inner pressure for forming said deposited film is regulated to 1 Torr or less.

3. A process according to claim 1, wherein said forming step includes depositing an amorphous silicon functional deposited film on each of said cylindrical substrates.

4. A process according to claim 3, including forming an amorphous silicon functional deposited film as a light receiving layer of an electrophotographic photosensitive cylindrical member.

* * * * *

UNITED STATES PATENT AND TRADEMARK OFFICE
CERTIFICATE OF CORRECTION

PATENT NO. : 4,897,284

DATED : January 30, 1990

INVENTOR(S) : Takayoshi Arai, et al

It is certified that error appears in the above-identified patent and that said Letters Patent is hereby corrected as shown below:

ON THE TITLE PAGE:

In [30] FOREIGN APPLICATION PRIORITY DATA

Insert, --Mar. 3, 1988  [JP]  Japan ................. 63-048773--.

In [57] ABSTRACT

Line 1 from bottom, "4 Claims, No Drawings" should read
    --4 Claims, 12 Drawing Sheets--.

The title page should be deleted to be replaced with the attached title page.

The sheets of drawings consisting of Figs. 1-12, should be added as shown on the attached pages.

COLUMN 1

Line 38, "method" should read --methods--.

COLUMN 2

Line 39, "Explaning" should read --Explaining--.
 Line 50, "atmospheres" should read --atmosphere--.

COLUMN 3

Line 46, "hundred" should read --a hundred--.

United States Patent [19]

Arai et al.

[11] Patent Number: 4,897,284
[45] Date of Patent: Jan. 30, 1990

[54] PROCESS FOR FORMING A DEPOSITED FILM ON EACH OF A PLURALITY OF SUBSTRATES BY WAY OF MICROWAVE PLASMA CHEMICAL VAPOR DEPOSITION METHOD

[75] Inventors: Takayoshi Arai; Shigehira Iida; Junichiro Hashizume; Tetsuya Takei, all of Ueno; Keishi Saitoh, Nabari, all of Japan

[73] Assignee: Canon Kabushiki Kaisha, Tokyo, Japan

[21] Appl. No.: 166,553

[22] Filed: Mar. 10, 1988

[30] Foreign Application Priority Data

Mar. 27, 1987 [JP] Japan .................... 62-073561

[51] Int. Cl.⁴ ............................................. B05D 3/06
[52] U.S. Cl. ..................................... 427/39; 427/45.1; 118/723
[58] Field of Search .................. 427/39, 45.1; 118/723

[56] References Cited

U.S. PATENT DOCUMENTS

| 4,582,720 | 4/1986 | Yamazaki | 118/723 |
| 4,678,644 | 7/1987 | Fukuta et al. | 118/723 |
| 4,729,341 | 3/1988 | Fournier et al. | 427/39 |
| 4,760,008 | 7/1988 | Yamazaki et al. | 427/39 |

FOREIGN PATENT DOCUMENTS 61-136221  6/1986  Japan ........................... 118/723

Primary Examiner—Stanley Silverman
Attorney, Agent, or Firm—Fitzpatrick, Cella, Harper & Scinto

[57] ABSTRACT

An improvement in the known MW-PCVD process for forming a deposited film on each of a plurality of cylindrical substrates being so arranged as to surround the discharging space in a substantially enclosed reaction space of a deposition chamber by the glow discharge of raw material gas to generate plasmas containing reactive gaseous materials causing the formation of said deposited film in the discharging space while rotating said plurality of substrates, which comprises providing a gas feed pipe provided with a plurality of gas liberation holes opening into the discharging space in every space between every two of the substrates so as to form an encircled discharging space and an open non-discharging space by said plurality of cylindrical substrates and a plurality of gas feed pipes and regulating the deposit thickness to be deposited per a rotation cycle of the substrate passing through the discharging space and the non-discharging space to a 1000 Å or less.

4 Claims, 12 Drawing Sheets

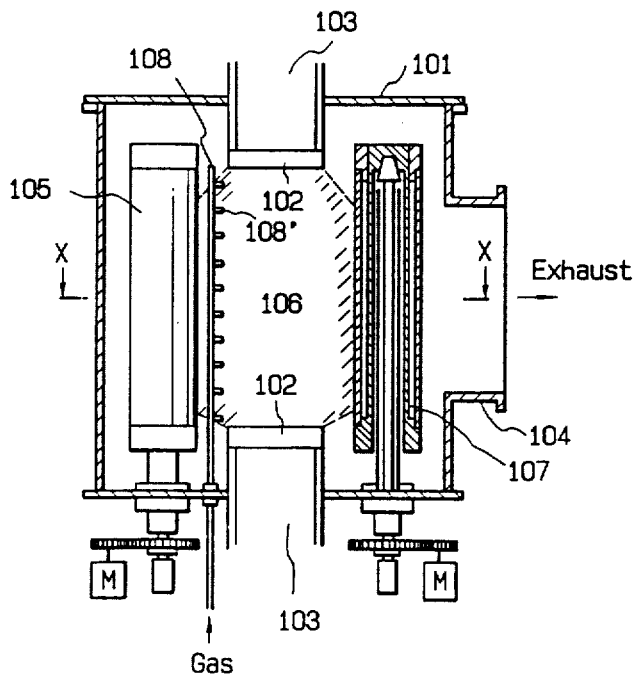

Thickness per one-cycle deposit (Å)

Thickness per one-cycle deposit (Å)

Thickness per one-cycle deposit (Å)

UNITED STATES PATENT AND TRADEMARK OFFICE
CERTIFICATE OF CORRECTION

PATENT NO. : 4,897,284

DATED : January 30, 1990

INVENTOR(S) : TAKAYOSHI ARAI, ET AL

It is certified that error appears in the above-identified patent and that said Letters Patent is hereby corrected as shown below:

COLUMN 4

Line 19, "an" should read --a--.
    Line 24, "an" should read --a--.
    Line 29, "an" should read --a--.
    Line 35, "an" should read --a--.
    Line 43, "back ground" should read --background--.
    Line 47, "an" should read --a--.
    Line 57, "an" should read --a--.

COLUMN 6

Line 23, "an" should read --a--.
    Line 32, "has" should read --it has--.
    Line 37, "an" should read --a--.
    Line 52, "an" should read --a--.

COLUMN 7

Line 5, "an" should read --a--.
    Line 31, "an" should read --a--.
    Line 35, "carring" should read --carrying--.
    Line 37, "inventor" should read --inventors--.
    Line 52, "an" should read --a--.
    Line 55, "what" should read --the--.

COLUMN 8

Line 51, "an" should read --a--.
    Line 54, "an" should read --a--.

UNITED STATES PATENT AND TRADEMARK OFFICE
CERTIFICATE OF CORRECTION

PATENT NO. : 4,897,284
DATED : January 30, 1990
INVENTOR(S) : TAKAYOSHI ARAI, ET AL It is certified that error appears in the above-identified patent and that said Letters Patent is hereby corrected as shown below:

COLUMN 9

Line 11, "back" should read --back- --.
    Line 17, "an" should read --a--.
    Line 34, "preferablyadjusted" should read --preferably adjusted--.
    Line 40, "an" should read --a--.
    Line 43, "is" should read --that is--.
    Line 59, "an" should read --a--.

COLUMN 10

Line 29, "(being" should read --being--.
    Line 33, "rolating" should read --rotating--.

COLUMN 11

Line 42, "the" should read --of the--.

COLUMN 13

TABLE 6, " : Excellent    should read -- ⊚: Excellent
             : Good "                       ○: Good --.

COLUMN 15

TABLE 8-continued, " ○: Excellent" should read -- ⊚: Excellent--.
    Line 18, "am" should read --a--.

UNITED STATES PATENT AND TRADEMARK OFFICE
CERTIFICATE OF CORRECTION

PATENT NO. : 4,897,284

DATED : January 30, 1990

INVENTOR(S) : TAKAYOSHI ARAI, ET AL

It is certified that error appears in the above-identified patent and that said Letters Patent is hereby corrected as shown below:

COLUMN 16

Line 18, "circumscribed" should read --cylindrical substrates circumscribed--.

Signed and Sealed this

Thirtieth Day of March, 1999

Attest:

STEPHEN G. KUNIN

Attesting Officer

Acting Commissioner of Patents and Trademarks